(12) United States Patent
Jiang et al.

(10) Patent No.: US 8,735,723 B2
(45) Date of Patent: May 27, 2014

(54) APPARATUS AND METHOD FOR PROVIDING ELECTRIC CABLES WITHIN A MAGNETIC RESONANCE IMAGING SYSTEM

(75) Inventors: Longzhi Jiang, Florence, SC (US); Robert Belinski, Florence, SC (US); Robbi McDonald, Florence, SC (US)

(73) Assignee: General Electric Company, Schenectady, NY (US)

( * ) Notice: Subject to any disclaimer, the term of this patent is extended or adjusted under 35 U.S.C. 154(b) by 263 days.

(21) Appl. No.: 12/946,603

(22) Filed: Nov. 15, 2010

(65) Prior Publication Data

US 2012/0118630 A1    May 17, 2012

(51) Int. Cl.
*H02G 15/02* (2006.01)
*H01R 9/05* (2006.01)

(52) U.S. Cl.
USPC ............................ 174/79; 174/74 R; 324/318

(58) Field of Classification Search
USPC ..................... 174/74 R, 76, 79; 324/200–263
See application file for complete search history.

(56) References Cited

U.S. PATENT DOCUMENTS

| | | | |
|---|---|---|---|
| 4,731,502 A * | 3/1988 | Finamore | 174/74 R |
| 5,159,929 A | 11/1992 | Morris et al. | |
| 6,556,012 B2 | 4/2003 | Yamashita | |
| 6,867,593 B2 | 3/2005 | Menon et al. | |
| 6,933,722 B2 | 8/2005 | Tsuda et al. | |
| 7,307,421 B2 | 12/2007 | Kurome et al. | |
| 7,345,485 B2 | 3/2008 | Jevtic et al. | |
| 7,382,132 B1 | 6/2008 | Mathew et al. | |
| 7,498,814 B1 | 3/2009 | Huang et al. | |
| 7,678,994 B2 * | 3/2010 | Morand | 174/76 |
| 7,746,072 B2 | 6/2010 | Van Helvoort et al. | |
| 2001/0022515 A1 | 9/2001 | Yamashita et al. | |
| 2005/0073299 A1 * | 4/2005 | Yoshikawa et al. | 324/207.25 |
| 2007/0026733 A1 | 2/2007 | Greim et al. | |
| 2007/0247143 A1 * | 10/2007 | Ikeda et al. | 324/207.25 |
| 2009/0030305 A1 | 1/2009 | Hoogeveen | |
| 2010/0018768 A1 * | 1/2010 | Takahashi et al. | 174/74 R |
| 2010/0056901 A1 | 3/2010 | Randell | |
| 2010/0137704 A1 | 6/2010 | Vij et al. | |
| 2010/0217113 A1 | 8/2010 | Jenkins et al. | |

FOREIGN PATENT DOCUMENTS

| | | |
|---|---|---|
| DE | 102005015393 A1 | 7/2006 |
| JP | 1262852 A | 10/1989 |
| JP | 2005027863 A | 2/2005 |

OTHER PUBLICATIONS

Unofficial translation of Search Report and Written Opinion from NL Application No. 2007774, Sep. 19, 2012.

* cited by examiner

*Primary Examiner* — Jayprakash N Gandhi
*Assistant Examiner* — Dion Ferguson
(74) *Attorney, Agent, or Firm* — The Small Patent Law Group; Dean D. Small

(57) ABSTRACT

An apparatus and method for mounting cables within a magnetic resonance imaging (MRI) system are provided. One apparatus includes a cable assembly having a rigid support structure defining a channel with a cross-section and an electrical cable having a cross-section smaller than the cross-section of the channel. The electrical cable is secured within the channel of the rigid support structure, with the rigid support structure configured for coupling to a stationary component of the MRI system to resist movement from a movable component to which the electrical cable is connected.

19 Claims, 8 Drawing Sheets

US 8,735,723 B2

APPARATUS AND METHOD FOR PROVIDING ELECTRIC CABLES WITHIN A MAGNETIC RESONANCE IMAGING SYSTEM

BACKGROUND OF THE INVENTION

The subject matter disclosed herein relates generally to diagnostic imaging systems, and more particularly to mounting cables within a Magnetic Resonance Imaging (MRI) system, particularly cables providing electrical connections within the MRI system.

MRI systems can include a superconducting magnet that generates a temporally constant (i.e., uniform and static) primary or main magnetic field. MRI data acquisition is accomplished by exciting magnetic moments within the primary magnetic field using magnetic gradient coils receiving signals through cables extending within the gantry of the MRI system. For example, in order to image a region of interest, the magnetic gradient coils are sequentially pulsed to create pulsed magnetic gradient fields in a bore of an MRI scanner to selectively excite a volume corresponding to the region of interest in order to acquire MR images of the region of interest. The resultant image that is generated shows the structure and function of the region of interest.

In conventional MRI systems, the mounting arrangement for electrical connections for the gradient coils must adequately support the cables communicating the signals to the gradient coils. In particular, current pulses applied (e.g., as part of a pulse sequence) to the gradient coils to generate time-varying magnetic fields can induce eddy currents that cause motion or vibration of the gradient coils. If adequate support is not provided and excess motion results, such as from electro-magnetic coupling and vibration during coil pulsing, image artifacts can be caused in resultant images (e.g., white pixels in the images). However, if the mouthing arrangement is too rigid, stress will be placed on the gradient coil terminal due to the electro-magnetic coupling and vibration, which can result in breaking the cable or terminal.

Known methods and mounting arrangements, such as brackets and plates that attempt to solve these problems are difficult to install, heavy, expensive and may require additional components, such as strain relief, which can cause other issues (e.g., loosening of fasteners). These known methods and mounting arrangements may likewise still suffer from some of the problems associated with providing not enough support or too much support.

BRIEF DESCRIPTION OF THE INVENTION

In accordance with one embodiment, a cable assembly for a Magnetic Resonance Imaging (MRI) system is provided that includes a rigid support structure defining a channel having a cross-section and an electrical cable having a cross-section smaller than the cross-section of the channel. The electrical cable is secured within the channel of the rigid support structure, with the rigid support structure configured for coupling to a stationary component of the MRI system to resist movement from a movable component to which the electrical cable is connected.

In accordance with another embodiment, an electrical connection arrangement for a Magnetic Resonance Imaging (MRI) system is provided that includes a magnet flange of an MRI system and a rigid tube defining a channel and coupled to the magnet flange. The electrical connection arrangement also includes an electrical cable extending and secured within the rigid tube and an electrical terminal, wherein one end of the electrical cable is connected to the electrical terminal.

In accordance with yet another embodiment, a method for providing a supported cable for a Magnetic Resonance Imaging (MRI) system includes inserting an electrical cable within a rigid tube and securing the electrical cable within the rigid tube to form a cable assembly. The method also includes coupling the cable assembly to a magnet flange of the MRI system with one end of the electrical cable connected to a gradient coil terminal of a gradient coil of the MRI system.

DETAILED DESCRIPTION OF THE INVENTION

Figure 1:
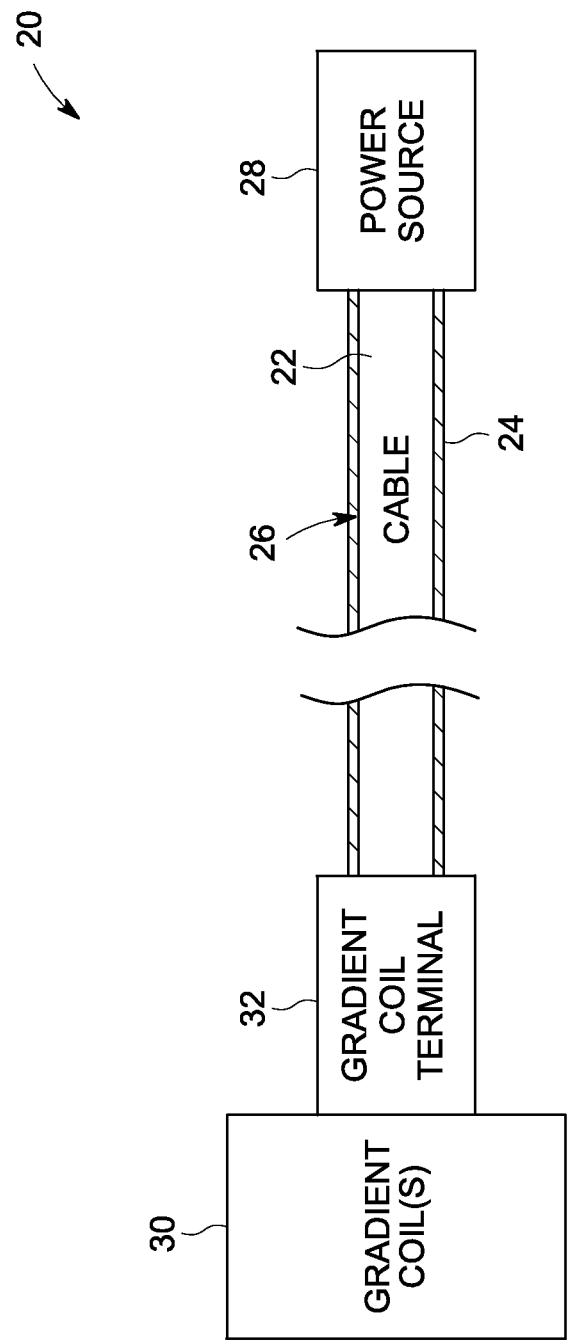
FIG. 1 is a simplified block diagram of a cable support arrangement formed in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors or memories) may be implemented in a single piece of hardware (e.g., a general purpose signal processor or random access memory, hard disk, or the like). Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Methods and apparatus are provided for supporting and mounting electrical connections, such as electrical cables, within a Magnetic Resonance Imaging (MRI) system. For example, various embodiments provide a support structure (e.g., a tube or channel) surrounding at least a portion of an electrical cable for a gradient coil electrical connection. The cable may be maintained within the support in different ways, including, for example, by potting or crimping. By practicing at least one embodiment, vibration of electrical cables within an MRI system is resisted and is relieved at, for example, the connection to the gradient coil.

It should be noted that the various embodiments are not limited to implementation with electrical cables, but may be used in connection with other cables, such as optical cables, among others. Additionally, although the various embodiments may be described wherein electrical connections are provided to a gradient coil, other connection may be made, such as to a Radio-Frequency (RF) coil within the MRI system.

FIG. 1 illustrates a simplified block diagram of a cable support arrangement 20 formed in accordance with various embodiments. The cable support arrangement 20 supports and maintains a cable 22 with a support structure 24 that is rigidly mounted within the MRI system, but that also allows absorption of forces caused by, for example, electro-magnetic coupling and vibration. The support structure 24 can be any structure capable of supporting at least a portion of the cable 22 therein, such as a tube or channel that surrounds a portion or all of the cable 22. For example, the support structure 24 may be a tube having a cross-section (e.g., diameter) slightly larger than the cross-section of the cable 22 such that a gap 26 is provided circumferentially around the cable 22 within the support structure 24. The size of the gap 26 may be varied based on, for example, the size of the cable 22, the amount of force expected to be applied to the cable 22, etc.

In some embodiments, the cable 22 provides electrical connection between a power source 28 (e.g., pulse generation source) and one or more components within the MRI system, such as components that are movable. For example, the cable 22 may be any suitable electrical cable or wire that provides electrical connection between a power source 28 external to the MRI system (or external to a magnet system of the MRI system) and one or more components within the MRI system. The one or more components may be any component within the MRI system requiring power or signals, such as one or more gradient coil(s) 30, which are connected to the cable 22 via a connection member, such as an electrical terminal, illustrated as a gradient coil terminal 32. The connection member may be any suitable connection member, such as a terminal connection suitable for an MRI system. It should be noted that the one or more gradient coil(s) 30 or associated components may move during operation thereof.

Figure 2:
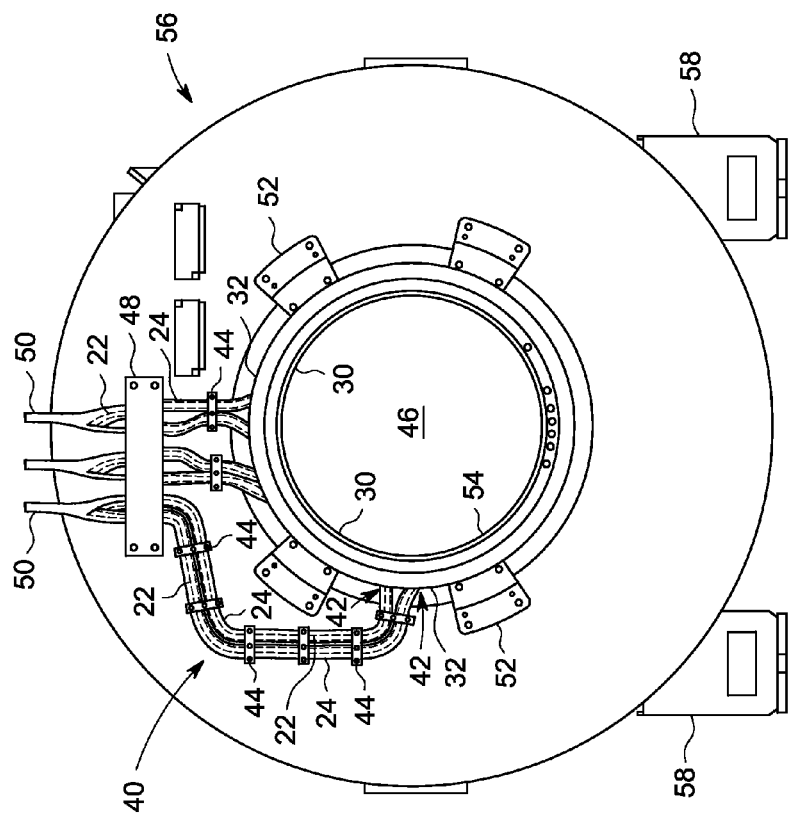
FIG. 2 is a diagram showing a magnet flange of a Magnetic Resonance Imaging (MRI) system having a cable support arrangement formed in accordance with various embodiments connected thereto.

The cable support arrangement 20 may be used to mount the cable 22 to any portion of the MRI system, for example, a stationary component, such as a magnet flange 40 as illustrated in FIG. 2, which shows a portion of the interior of a gantry of the MRI system. It should be noted that the support structure 24 may surround the entire length of the cable 22 or a potion of the length of the cable 22. For example, in a terminal region 42 surrounding the gradient coil terminal 32, which is illustrated as a portion of the cable 22 adjacent the coil terminal 32 (e.g., one inch), the cable 22 may extend from and not be surrounded by the support structure 24. Accordingly, in this terminal region 42 the cable 22 in various embodiments is unsupported, which can allow flexibility for strain relief.

As can be seen in FIG. 2, the support structure 24 is mounted to the flange 40 by a plurality of fasteners 44, which may be brackets or any other suitable mounting device. It should be noted that the cables 22 are shown for illustration, but are encompassed partially or entirely by the support structure 24 in some embodiments. The fasteners 44 may be secured to the flange 40 by bolts or other suitable types of securing members. It should be noted that more or less fasteners 44 than are illustrated may be provided, such as based on support requirements, the length of the cable 22, the number of turns or bends in the cable 22, etc. The fasteners 44 secure to the outside of the support structure 24 (e.g., to a planar end face of the flange 40) to securely maintain the position of the support structure 24 on the flange 40, such that in various embodiments at least a portion of the support structure 24 is in contact with the flange 40. However, in other embodiments, the support structure 24 may be separated from the flange 40 by a space, for example, if the fasteners 44 include an elevated base.

The fasteners 44 may be separate from or formed as part of the support structure 24. In some embodiments, the fasteners 44 include a curved portion for receiving therein at least a portion of the circumference of the support structure 24 and securing the support structure 24 to the flange 40.

It should be noted that other fasteners or components may be provided, such as an interface 48 that provides connections between the external power source 28 (shown in FIG. 1) and the cables 22 providing power to the gradient coils 30. In various embodiments, additional cables 50 (or wires) that are different than the cables 22 connect the power source 28 to the interface 48. The cables 50 may not include the support structure 24.

The flange 40 in the illustrated embodiment is a magnet flange having a bore 46 therethrough. For example, the flange 40 may be provided on each end of a magnet coil support structure 56 (e.g., magnet former) that supports a superconducting magnet of the MRI system. Other components may be provided such as brackets 52 mounting an inner support structure 54 to the flange 40. Additionally, the magnet coil support structure 56 may include legs 58 for maintaining the magnet coil support structure 56 in a vertical orientation and optionally securing the flange 40 to a support, such as the floor to resist or prevent movement thereof.

Figure 3:
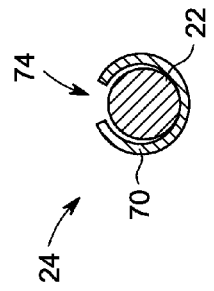
FIG. 3 is a cross-sectional view taken through a diameter of a support structure formed in accordance with one embodiment.
Figure 4:
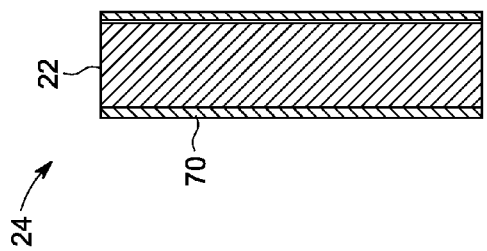
FIG. 4 is a cross-sectional view taken along a length of the support structure of FIG. 3.

Various embodiments and configurations of the support structure 24 may be provided and will now be described. It should be noted that although different embodiments are illustrated and described separately, one or more of the embodiments or features thereof may be combined. Additionally, different configurations and modifications to the illustrated embodiments are contemplated. FIGS. 3 and 4 illustrate one embodiment of the support structure 24 formed from a tube 60 (e.g., a rigid conduit) having a passageway or channel therethrough for receiving therein the cable 22. The tube 60 in various embodiments is formed as a rigid structure having a cross-section greater than the cross-section of the cable 22 to define the gap 26. The tube 60 may be formed from any rigid material, such as from a metal, for example, stainless steel. However, other metals and non-metals may be used that provide rigid properties. The rigidity of the tube 60 may be determined based on the length of tube 60, the amount of movement expected, etc.

In various embodiments, the cable 22 is potted or embedded within the tube 60 with the cable 22 spirally wound with a glass fiber to provide additional support or reinforcement after potting. Thus, the support structure 24 illustrated in FIGS. 3 and 4 provides the cable 22 potted within the rigid hollow tube 60. The potting of the cable 22 within the tube 60 includes filling the gap 26 with a material. For example, in some embodiments, the cable 22 is inserted within the tube 60, with the tube 60 thereafter filled with an epoxy 62 to fill the gap 26. The epoxy 62 is then cured, for example, the epoxy 62 may be formed by any suitable curing process using a resin and a hardener. Other materials may be used to file the gap 26, such as foams, which may have expanding properties to fill the gap 26.

It should be noted that spacers (not shown) may be used to maintain the cable 22 centered within the tube 60 during the potting process. It also should be noted that the cable 22 may be centered exactly within the center of the tube 60, but optionally may be offset therein, which may occur, for example, during potting.

Thus, the potting process fills the gap 26 with a material that hardens such that the cable 22 in encased within the tube 60 to resist vibration, and which also may act to resist moisture and other corrosive agents. The potting process may harden the filler material to different degrees of hardness based on the amount of vibration resistance desired or needed.

As can be seen, the fastener 44 may include openings 64 for use in mounting the tube 60 to the flange 40 (shown in FIG. 2). For example, bolts or other securing members may be inserted through the openings 64 and secured within complementary openings (e.g., threaded bores) in the flange 40.

Figure 5:
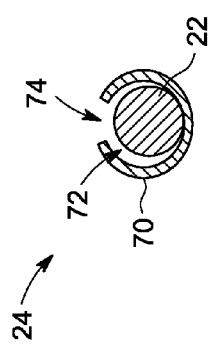
FIG. 5 is a cross-sectional view taken through a diameter of a support structure formed in accordance with another embodiment.
Figure 6:
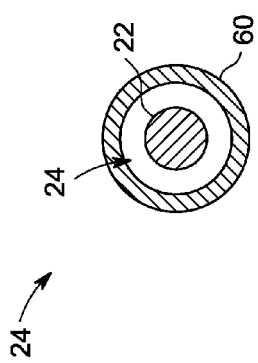
FIG. 6 is a cross-sectional view of the support structure of FIG. 5 showing a crimped state of the support structure.
Figure 7:
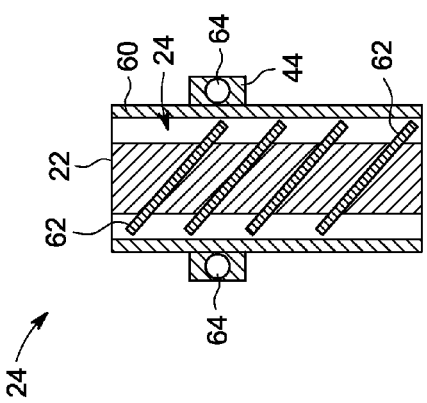
FIG. 7 is a cross-sectional view taken along a length of the support structure of FIGS. 5 and 6.

In another embodiment, the support structure 24 includes a slotted tube 70 as illustrated in FIGS. 5 through 7, wherein the slotted tube 70 does not form a completely enclosed channel like the tube 60. Similar to the tube 60, the slotted tube 70 has a cross-section that is larger than the cross-section of the cable 22 to provide a gap 72 therein. The slotted tube 70 includes an axially extending slot 74 along the circumference of the slotted tube 70. The slot 74 defines spacing between ends of the slotted tube 70 that allows mechanical crimping as described below. The tube 70 is again formed from a rigid material, but may have material properties or a thickness that allows for deformation, compression or crimping to secure the cable 22 within the slotted tube 70.

In various embodiments, the cable 22 is inserted within the slotted tube 70 and rests against a portion of the inner surface of the slotted tube as shown in FIG. 5. As can be seen, the gap 72 is provided along a portion of the circumference of the cable 22 including at the slot 74. The slot 74 is then pressed together or crimped, such as by applying a mechanical force using crimping pliers (or other suitable device) to reduce the spacing between the ends, which makes the slot 74 smaller and secures the cable 22 within the slotted tube 70 as shown in FIG. 6. It should be noted that when pressure is applied to the slotted tube 70, the structure of the slotted tube 70 also may deform slightly such that the cross-section of the channel defined therethrough may be slightly oval shaped instead of circular. However, in other embodiments, the cross-section maintains a generally circular shape.

As can be seen, most of the circumference of the cable 22 in FIG. 6 abuts the inner surface of the slotted tube 70 to maintain the position of the cable 22 within the slotted tube 70 after pressure has been applied to squeeze the slot 74 closer together. The pressure applied to the slotted tube 70 in various embodiments compresses the slotted tube 70 around a substantial portion of the circumference of the cable 22. Thus, the cable 22 is maintained within a rigid channel defined by the slotted tube 70, which may be secured to the flange 40 (shown in FIG. 2) similar to the tube 60.

Figure 9:
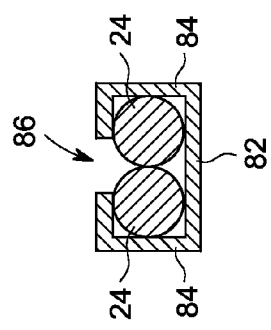
FIG. 9 is a cross-sectional view of the support structure of FIG. 8 showing a crimped state of the support structure.
Figure 10:
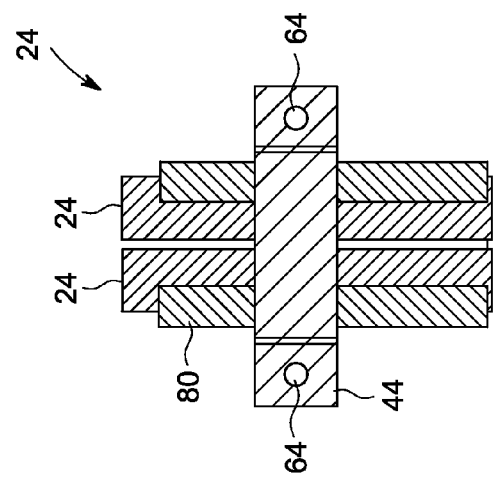
FIG. 10 is a cross-sectional view taken along a length of the support structure of FIGS. 8 and 9.
Figure 8:
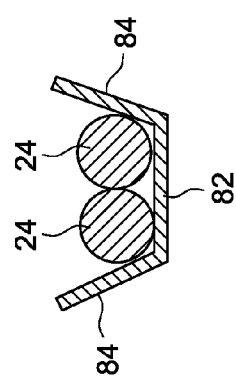
FIG. 8 is a cross-sectional view taken through a diameter of a support structure formed in accordance with another embodiment.

In some embodiments more than one cable 22 may be maintained within the support structure 24, for example, as illustrated in FIGS. 8 through 10. In these embodiments, a plurality of cables 22 (two cables 22 are illustrated in FIGS. 8 through 10) are secured within a compressible support structure 80. The cables 22 may be, for example, positive and negative electrical connection cables. Similar to other embodiments, the compressible support structure 80 has a cross-section (at a base and sides in this embodiment) that is larger than the cross-section of the two cables 22. It should be noted that although the compressible support structure 80 is illustrated as having a planar base 82 and two angled walls 84, the compressible support structure 80 may likewise have a substantially circular cross-section similar to the slotted tube 70.

The compressible support structure 80 includes walls 84 that are compressible. Accordingly, the compressible support structure 80 is again formed from a rigid material, but may have material properties or a thickness that allows for compression or crimping to secure the cables 22 within the compressible support structure 80.

In various embodiments, the cables 22 are inserted within the compressible support structure 80 and rest against the inner surface of the base 82 of the compressible support structure 80 as shown in FIG. 8. The angled walls 84 are then compressed and deformed, such as pressed together or crimped, such as by applying a mechanical force using crimping pliers (or other suitable device) to reduce the spacing between the ends of the angled walls 84. For example, as illustrated in FIG. 9, after compressing the angled walls 84, the angled walls 84 may be deformed such that the cross-section of the compressible support structure 80 is generally rectangular to define a rectangular channel therein to maintain the position of the cables 22 in a parallel arrangement.

It should be noted that after compression, a slot 86 still exists, but the cables 22 are secured in place within the compressible support structure 80. The pressure applied to the compressible support structure 80 in various embodiments compresses and deforms the compressible support structure 80 around the cables 22 such that the cables 22 are maintained in parallel alignment. Thus, the cables 22 are maintained within a rigid channel defined by the compressible support structure 80, which may be secured to the flange 40 (shown in FIG. 2) similar to the tube 60.

Figure 11:
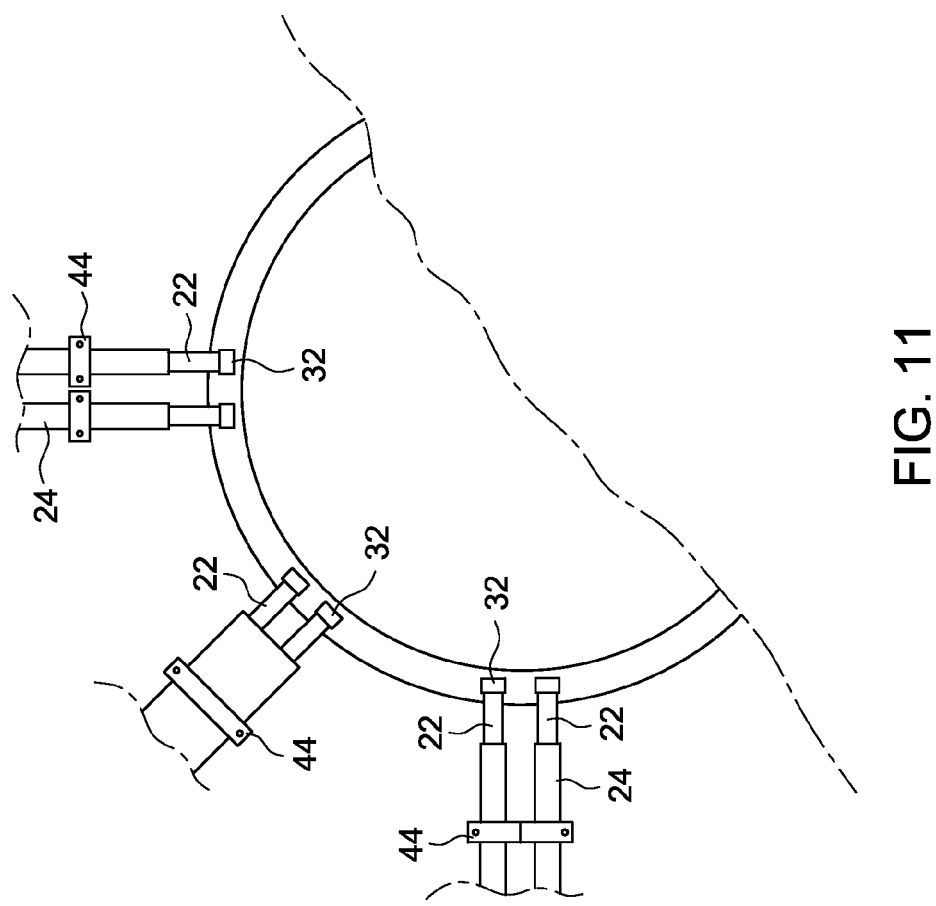
FIG. 11 is a simplified diagram showing a portion of an MRI system having a connection arrangement in accordance with various embodiments.

Variations and modification to the various embodiments are contemplated. For example, instead of the compressible support structure 80, a wrapping structure or method may be used to hold the two cables 22 (or more cables 22) together along a parallel axis (similar to a circular tube). In operation, the pulses communicated through the two cables 22 are cancelled out, such as during pulsing of the gradient coils 30 (shown in FIG. 1). As another example, which is illustrated in FIG. 11, a length of the cable 22 extends from the support structure 24, such as at the gradient coil terminal 32 to provide flexibility for strain relief. It also should be noted that the support structure 24 may be sized and shaped as desired or needed, such as to have different shaped cross-sections, as well as to bend or curve as desired or needed, for example, based on connection requirements.

Thus, a support and mounting arrangement for an MRI system are provided that secure electrical cables therein. The support structure provides rigidity to support the cable and resist movement, such as vibration.

Figure 12:
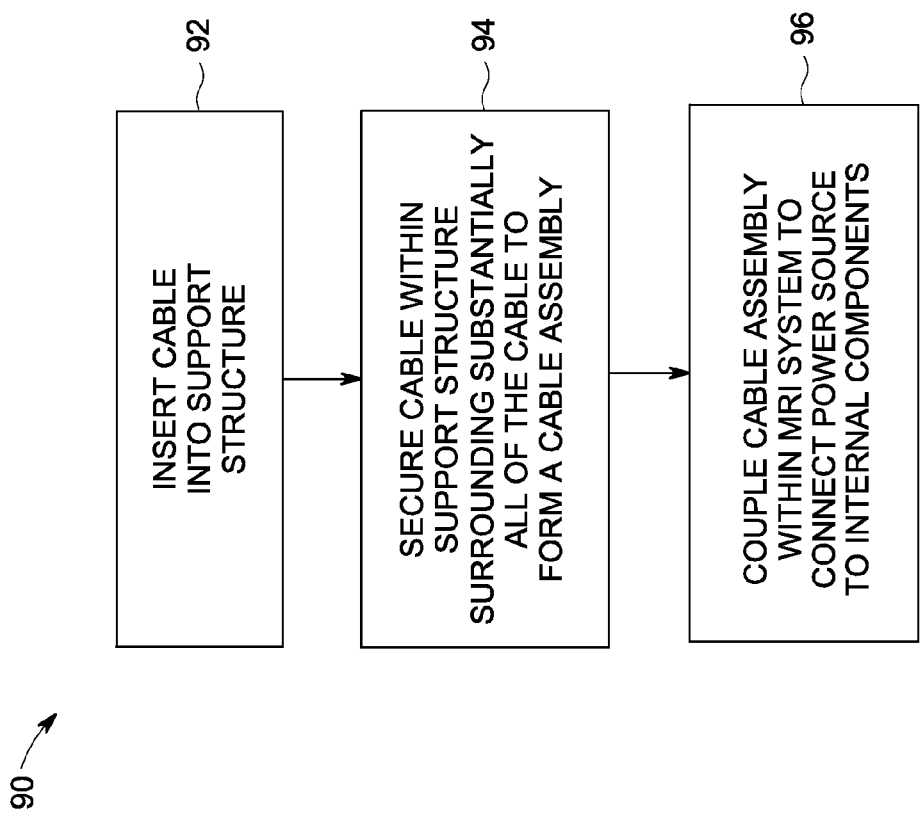
FIG. 12 is a flowchart of a method for providing a supported cable for an MRI system in accordance with various embodiments.

In various embodiments, a method 90 is illustrated in FIG. 12 for providing a supported cable for an MRI system. The method 90 includes inserting an electrical cable into a support structure at 92. The electrical cable may be any suitable cable, for example, a cable capable of communicating electrical signals to control one or more gradient coils of an MRI system. In various embodiments, the support structure is a rigid structure that defines a passageway or channel that completely or partially surrounds the cable while providing a circumferential gap around the cable.

With the cable inserted within the support structure, the cable is secured therein at 94 such that the support structure surrounds the entire cable or substantially all of the cable to form a cable assembly. For example, the support structure may be a tube that is filled with an epoxy such that the cable is potted within the tube. In other embodiments, the tube may be slotted such that one or more cables are crimped therein. It should be noted that the cable assembly may include a length of cable that extends beyond the end of the support structure and is, thus, flexible and define a flexible cable portion.

The cable assembly is then coupled within the MRI system at 96, which then can provide electrical connection between, for example, a power or pulsing source (e.g., external to the MRI system) and internal components, such as gradient coils. The cable assembly may be coupled to different stationary portions within the MRI system, such as to a magnet flange.

Figure 13:
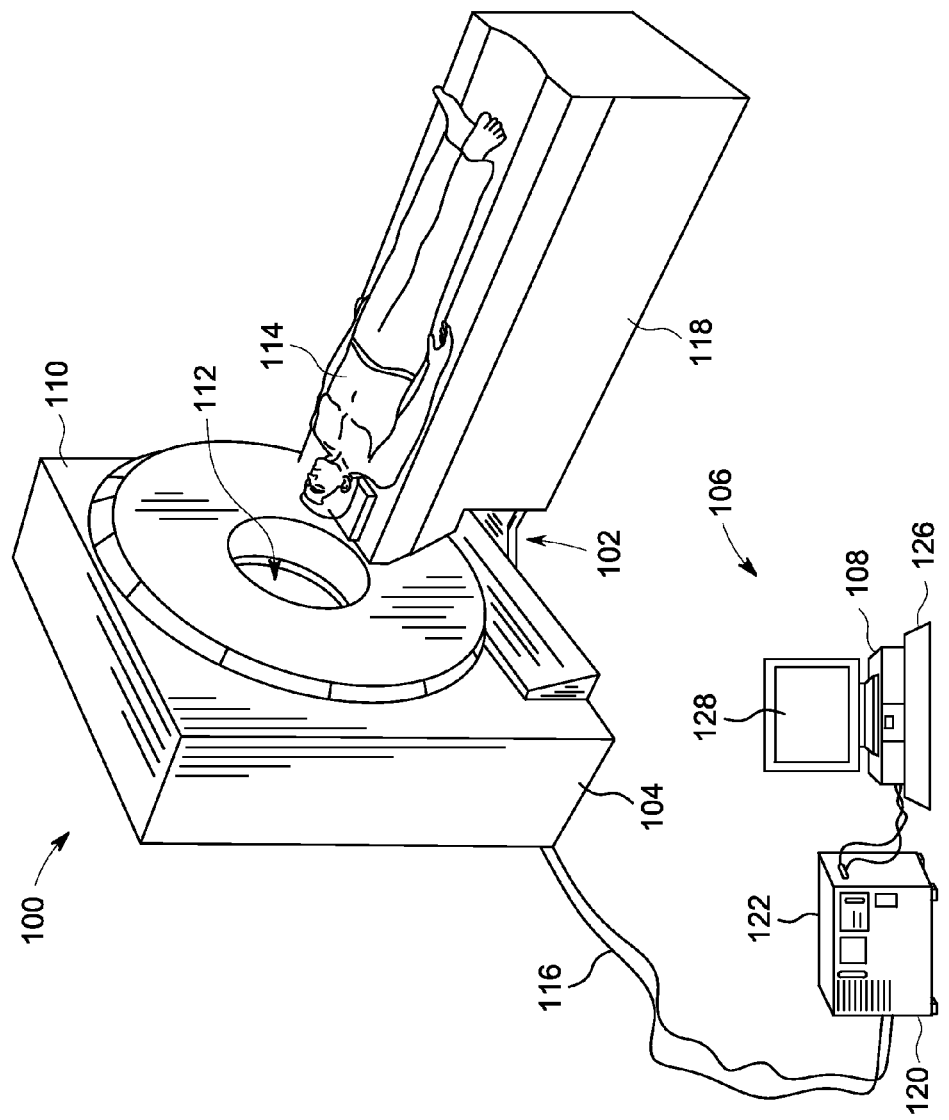
FIG. 13 is a pictorial view of an MRI system in which a cable support arrangement formed in accordance with various embodiments may be implemented.

The supported cable structure or assembly of various embodiments may be provided in connection with different types of diagnostic medical imaging systems, such as the imaging system 100 as shown in FIG. 13. It should be appreciated that although the imaging system 100 is illustrated as a single modality imaging system and may be an MRI system, the various embodiments may be implemented in or with multi-modality imaging systems. The imaging system 100 may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Referring to FIG. 13, the imaging system 100 includes an imaging portion 102 having an imaging unit 104 (e.g., imaging scanner) and a processing portion 106 that may include a processor 108 or other computing or controller device. In particular, the imaging unit 104 enables the imaging system 100 to scan an object or patient 114 to acquire image data, which may be image data of all or a portion of the object or patient 114. The imaging unit 104 includes a gantry 110 that includes one or more imaging components (e.g., magnets or magnet windings within the gantry 110) that allow acquisition of the image data. In multi-modality imaging systems, in addition to the magnet(s) for magnetic resonance imaging, an x-ray source and detector for computed-tomography imaging, or gamma cameras for nuclear medicine imaging may be provided. The imaging components produce signals that represent image data that is communicated to the processing portion 106 via a communication link 116 that may be wired or wireless. It should be noted that the signals may be configured in different protocols, etc. It should also be noted that during an imaging scan by the imaging unit 104, the gantry 110 and the imaging components mounted thereon or therein may remain stationary or rotate about or along a center of rotation defining an examination axis through a bore 112. The patient 114 may be positioned within the gantry 110 using, for example, a motorized table 118.

Thus, in operation an output of one or more of the imaging components is transmitted to the processing portion 106, and vice versa, which for example, may include, transmitting signals to or from the processor 108 through a control interface 120. The processor 108 also may generate control signals for controlling the position of the motorized table 118 or imaging components based on, for example, user inputs or a predetermined scan. During a scan, image data, such as magnetic resonance image data from the imaging components may be communicated to the processor 108 through a data interface 122 via the control interface 120. The processor 108 and associated hardware and software used to acquire and process data may be collectively referred to as a workstation 124. The workstation 124 includes user input devices, such as a keyboard 126 and/or other input devices such as a mouse, a pointer, and the like, and a monitor 128. The monitor 128 displays image data and may accept input from a user if a touchscreen is available.

Figure 14:
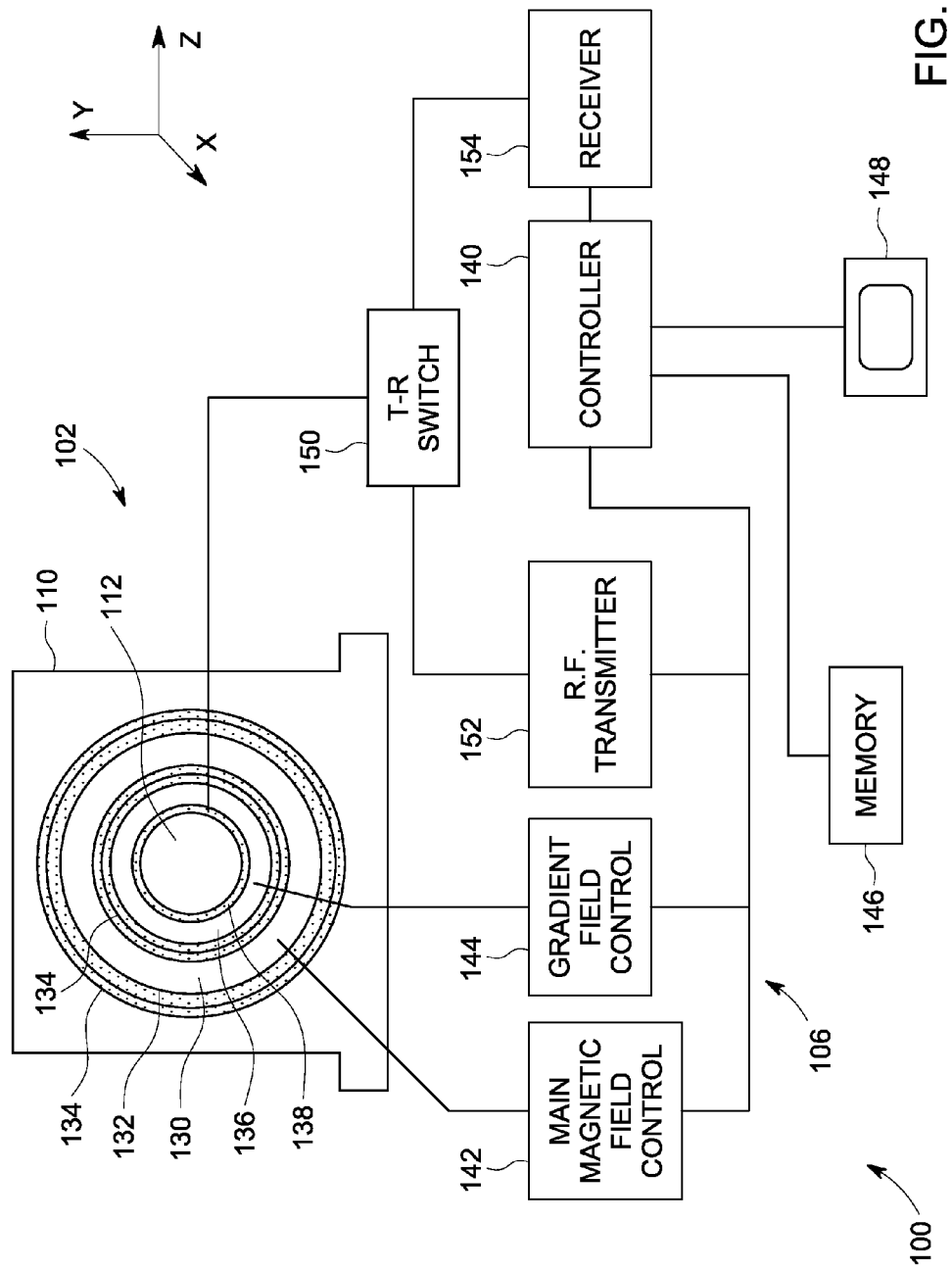
FIG. 14 is a schematic block diagram illustrating an MRI system in which a cable support arrangement formed in accordance with various embodiments may be implemented.

For illustrative purposes only, the imaging system 100 may be implemented as an MRI system as shown in FIG. 14, which generally includes the imaging portion 102 and the processing portion 106 that may include a processor or other computing or controller device as describe herein. The imaging system 100 generally includes within the gantry 110 a superconducting magnet 130 formed from coils, which may be supported on a magnet coil support structure. A helium vessel 132 (also referred to as a cryostat) surrounds the superconducting magnet 130 and may be filled with liquid helium. The liquid helium may be used to cool a coldhead sleeve and/or a thermal shield.

Thermal insulation 134 is provided surrounding the outer surface of the helium vessel 132 and the inner surface of the superconducting magnet 130. A plurality of magnetic gradient coils 136 are provided inside the superconducting magnet 130 and an RF transmit coil 138 is provided within the plurality of magnetic gradient coils 136. The components within the imaging system 100, including, for example, the magnetic gradient coils 136, which may be embodied as the gradient coils 30 (shown in FIG. 1) are provided with electrical connections using supported cables as described in more detail herein.

In some embodiments, the RF transmit coil 138 may be replaced with a transmit and receive coil. The components within the gantry 110 generally form the imaging portion 102. It should be noted that although the superconducting magnet 130 is a cylindrical shape, other shapes of magnets can be used.

The processing portion 106 generally includes a controller 140, a main magnetic field control 142, a gradient field control 144, a memory 146, a display device 148, a transmit-receive (T-R) switch 150, an RF transmitter 152 and a receiver 154.

In operation, a body of an object, such as a patient or a phantom to be imaged, is placed in the bore 112 on a suitable support, for example, a patient table. The superconducting magnet 130 produces a uniform and static main magnetic field $B_o$ across the bore 112. The strength of the electromagnetic field in the bore 112 and correspondingly in the patient, is controlled by the controller 140 via the main magnetic field control 142, which also controls a supply of energizing current to the superconducting magnet 130.

The magnetic gradient coils 136, which include one or more gradient coil elements, are provided so that a magnetic gradient can be imposed on the magnetic field $B_o$ in the bore 112 within the superconducting magnet 130 in any one or more of three orthogonal directions x, y, and z. The magnetic gradient coils 136 are energized by the gradient field control 144 and are also controlled by the controller 140.

The RF transmit coil 138, which may include a plurality of coils, is arranged to transmit magnetic pulses and/or optionally simultaneously detect MR signals from the patient if receive coil elements are also provided, such as a surface coil configured as an RF receive coil. The RF receive coil may be of any type or configuration, for example, a separate receive surface coil. The receive surface coil may be an array of RF coils provided within the RF transmit coil 138.

The RF transmit coil 138 and the receive surface coil are selectably interconnected to one of the RF transmitter 152 or receiver 154, respectively, by the T-R switch 150. The RF transmitter 152 and T-R switch 150 are controlled by the controller 140 such that RF field pulses or signals are generated by the RF transmitter 152 and selectively applied to the patient for excitation of magnetic resonance in the patient. While the RF excitation pulses are being applied to the patient, the T-R switch 150 is also actuated to disconnect the receive surface coil from the receiver 154.

Following application of the RF pulses, the T-R switch 150 is again actuated to disconnect the RF transmit coil 138 from the RF transmitter 152 and to connect the receive surface coil to the receiver 154. The receive surface coil operates to detect or sense the MR signals resulting from the excited nuclei in the patient and communicates the MR signals to the receiver 154. These detected MR signals are in turn communicated to the controller 140. The controller 140 includes a processor (e.g., image reconstruction processor), for example, that controls the processing of the MR signals to produce signals representative of an image of the patient.

The processed signals representative of the image are also transmitted to the display device 148 to provide a visual display of the image. Specifically, the MR signals fill or form a k-space that is Fourier transformed to obtain a viewable image. The processed signals representative of the image are then transmitted to the display device 148.

The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as an optical disk drive, solid state disk drive (e.g., flash RAM), and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application specific integrated circuits (ASICs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A cable assembly with a Magnetic Resonance Imaging (MRI) system, the cable assembly comprising:
    a rigid support structure defining a channel having a cross-section; and
    an electrical cable having a cross-section smaller than the cross-section of the channel, the electrical cable secured within the channel of the rigid support structure, the rigid support structure resisting vibration of the electrical cable from a movable component to which the electrical cable is connected, the rigid support structure configured for coupling to a stationary component of the MRI system, the rigid support structure extending along a length of the electrical cable and curved along at least a portion of the length to route the electrical cable along a surface of the stationary component, and wherein a portion of the electrical cable connected to the movable component is not supported by the rigid support structure to allow flexibility and provide strain relief of the electrical cable around the movable component.

2. The cable assembly of claim 1, wherein the rigid support structure comprises a tube circumferentially surrounding the entire electrical cable, wherein the electrical cable is potted within the tube.

3. The cable assembly of claim 2, wherein a gap is formed by the difference in cross-section of the tube and the electrical cable, and further comprising an epoxy filling the gap and potting the electrical cable within the tube.

4. The cable assembly of claim 3, further comprising a glass fiber wound around the electrical cable.

5. The cable assembly of claim 1, wherein the portion of the electrical cable not supported by the rigid support structure extending beyond an end of the rigid support structure, and the electrical cable exposed to a magnetic field generated by the MRI system.

6. The cable assembly of claim 5, wherein the portion of electrical cable extending beyond the end of the rigid support structure is configured to connect to a gradient coil terminal of a gradient coil of the MRI system and provide the strain relief around the gradient coil.

7. The cable assembly of claim 1, wherein the rigid support structure comprises a compressible slotted tube configured to be crimped to secure the electrical cable within the compressed slotted tube.

8. The cable assembly of claim 1, further comprising a plurality of electrical cables and wherein the rigid support structure comprises a compressible support structure having walls configured to be deformed to secure the plurality of electrical cables within the compressible support structure.

9. The cable assembly of claim 1, further comprising a fastener surrounding a portion of the rigid support structure and configured to secure the rigid support structure to the stationary component, the rigid support structure surrounding the electrical cable along substantially an entirety of the length of the electrical cable from one connection end to an opposite connection end, wherein the electrical cable is not supported by the rigid support at one or both of the connection ends.

10. The cable assembly of claim 1, wherein the stationary component is a magnet flange of the MRI system and the movable component is a gradient coil of the MRI system.

11. An electrical connection arrangement with a Magnetic Resonance Imaging (MRI) system, the electrical connection arrangement comprising:
    a magnet flange of an MRI system;
    a rigid tube defining a channel and coupled to the magnet flange;
    an electrical cable extending and secured within the rigid tube, the rigid tube resisting vibration of the electrical cable from a movable component to which the electrical cable is connected; and
    an electrical terminal, wherein one end of the electrical cable is connected to the electrical terminal and a portion of the end of the electrical cable connected to the electrical cable not supported by the rigid tube to allow flexibility and provide strain relief of the electrical cable around the electrical terminal and wherein the rigid tube surrounds the electrical cable along substantially an entirety of a length of the electrical cable from one end of the electrical cable to an opposite end at the electrical terminal.

12. The electrical connection arrangement of claim 11, further comprising a plurality of fasteners surrounding portions of the circumference of the rigid tube and coupling the rigid tube to the magnet flange.

13. The electrical connection arrangement of claim 11, wherein the electrical terminal is a gradient coil terminal and the portion of the electrical cable not supported by the rigid tube extending beyond an end of the rigid tube to define a flexible cable portion that is connected to the gradient coil terminal.

14. The electrical connection arrangement of claim 11, wherein the electrical cable has a cross-section smaller than the cross-section of the rigid tube and the electrical cable is potted within the rigid tube with an epoxy filling a gap formed between the electrical cable and the rigid tube.

15. The electrical connection arrangement of claim 11, wherein the rigid tube comprises a deformable metal, and wherein the electrical cable is secured within the rigid tube by a crimped connection.

16. The electrical connection arrangement of claim 11, further comprising a plurality of electrical cables secured within the rigid tube in a parallel alignment.

17. The electrical connection arrangement of claim 11, further comprising an additional electrical cable connected to the electrical cable within the rigid tube, the additional electrical cable being flexible.

18. The electrical connection arrangement of claim 11, wherein the rigid tube is coupled to a planar end face of the magnet flange.

19. The cable assembly of claim 1, wherein the rigid support structure comprises a tube circumferentially surrounding the electrical cable and having a gap therein formed by the difference in cross-section of the tube and the electrical cable, wherein the electrical cable is potted within the tube by a filler material within that gap that is cured to a degree of hardness to resist a defined amount of vibration.

* * * * *